Figure 1:
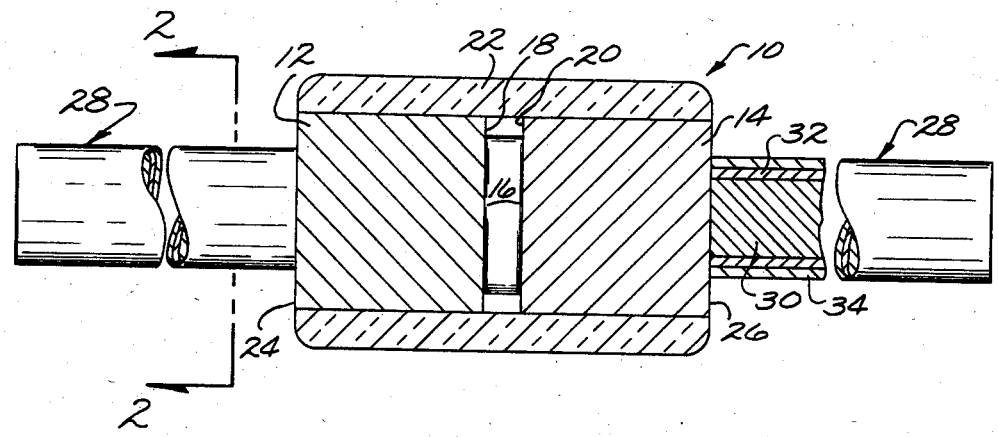

United States Patent [19]
Breit

[11] Patent Number: 4,598,473
[45] Date of Patent: Jul. 8, 1986

[54] PROCESS FOR PRODUCING REINFORCED STRUCTURAL ARTICLES AND ARTICLES PRODUCED THEREBY

[75] Inventor: Henry F. Breit, Attleboro, Mass.

[73] Assignee: Texas Instruments Incorporated, Dallas, Tex.

[21] Appl. No.: 607,888

[22] Filed: Jul. 12, 1984

Related U.S. Application Data

[62] Division of Ser. No. 299,417, Sep. 4, 1981.

[51] Int. Cl.[4] ............................................. H01R 43/00
[52] U.S. Cl. ........................................ 29/855; 29/621; 65/59.22; 228/243
[58] Field of Search ................. 29/825, 515, 509, 868, 29/855, 871, 856, 746, 621, 610 R; 228/243; 65/59.22

[56] References Cited

U.S. PATENT DOCUMENTS

| | | | |
|---|---|---|---|
| 2,947,078 | 8/1960 | Pflumm et al. | 228/243 X |
| 3,212,865 | 10/1965 | Miller | 428/677 X |
| 3,452,432 | 7/1969 | Manley | 29/621 |
| 3,950,142 | 4/1976 | Brenan et al. | 65/59.22 X |

*Primary Examiner*—Howard N. Goldberg
*Assistant Examiner*—Carl J. Arbes
*Attorney, Agent, or Firm*—John A. Haug; James P. McAndrews; Melvin Sharp

[57] ABSTRACT

An electric component such as a rectifier is shown in which the electric leads are formed from composite wire material. The wire material has a copper core surrounded by and metallurgically bonded to a layer of ferrous material such as steel having optimal concentricity which layer is in turn surrounded by and metallurgically bonded to a layer of copper.

7 Claims, 2 Drawing Figures

PROCESS FOR PRODUCING REINFORCED STRUCTURAL ARTICLES AND ARTICLES PRODUCED THEREBY

This application is a division of application Ser. No. 299,413, filed 9/4/81.

BACKGROUND OF THE INVENTION

This invention relates to electric components and more particularly to composite electrically conductive leads for such components.

In manufacturing certain electrical components, such as rectifiers, lead material is connected as by brazing to an electrically and thermally conductive base such as a block of molybdenum which, after having a semiconductor element mounted thereon, is sealed in glass by subjecting the assembly to a temperature sufficient to melt the glass. The assembly is then normally subjected to a coating operation such as a barrel plating operation, to apply a thin coating of tin or other suitable non-corrosive material to the surface of the lead material.

Various materials have been employed as the lead material including copper which, of course, has excellent electrical conductivity characteristics. However copper suffers from the disadvantage of being too easily bent, particularly in the annealed condition after having been subjected to the glass sealing operation so that subsequent barrel plating operations result in many of the leads being bent thereby rendering the devices useless or at least in need of corrective processing.

Another material which has been used for such electric leads is a copper alloy, zirconium copper. This material has acceptable electrical conductivity, in the order of 93% IACS (International Accepted Copper Standard) that is, the conductivity of zirconium copper is approximately 93% that of copper. However, this alloy is significantly more expensive than copper, in the order of four times as much and is subject to discoloration at elevated temperatures (e.g. above 1600° F.).

Yet another material which has been used for such electric leads is a composite material, a steel core clad with copper. Due to the steel core this material is sufficiently strong even after the glass sealing operation and has the added benefit of being magnetically attractable so that magnetic handling equipment can be used to facilitate processing of the electronic components. For example, the components can be magnetically oriented in a given direction to facilitate automatic inspection techniques. The electrical conductivity can be adjusted somewhat by varying the ratio of the copper to steel in the composite however, in any event, it is somewhat lower than copper or zirconium copper, i.e., in the order of 80% or less compared to copper. In certain devices, such as high power rectifiers, it is desirable to have higher conductivity characteristics but at levels of 70% or higher the magnetic characteristic becomes too small to be useful. The most difficult problem that this material has presented however, is that it is very difficult to produce the composite so that the steel core is concentric relative to the copper layer and lack of concentricity results in lower yields due to thermostatic deformation or bending of the leads when subjected to elevated temperatures as when the leads are brazed to the molybdenum block which involves subjecting at least a portion of the lead to a temperature in the order of 180° F.

It is therefore an object of the present invention to provide electric lead material for use with electronic devices capable of withstanding elevated processing temperatures. Another object is the provision of composite wire material which has high electrical conductivity and which has improved concentricity characteristics. Yet another object is the provision of a low cost electric lead material which is sufficiently strong, even after being subjected to elevated temperatures normally incident to the manufacture of associated components, to withstand further processing without being subject to bending of the leads.

Various other objects and advantages will appear from the following description of one embodiment of the invention and the novel features will be particularly pointed out hereinafter in connection with the appended claims.

SUMMARY OF THE INVENTION

Briefly, in accordance with the invention a rectifier or other electronic component comprises a thermally and electrically conductive member to which an electric lead has been attached by brazing or the like and which is thereafter subjected to high temperature processing such as by being placed in a furnace environment to melt glass and seal the component. The lead is a composite wire in which the core is comprised of copper, a relatively soft highly conductive material surrounded by the metallurgically bonded to a relatively hard ferrous layer which in turn is surrounded by and metallurgically bonded to a layer or sleeve of copper. The ferrous material comprises between approximately 5 and 25% of the cross sectional area of the composite which in the case of steel corresponds to between 95 and 75% of the electrical conductivity of copper. The ferrous strip, being relatively hard can be formed so that it is essentially concentric relative to the core. The ratio of the thicknesses of the copper core and sleeve components relative to one another can be varied with the outer layer or sleeve being made thicker where it is desired to optimize radial heat flow or where deformation is required in contacting the electric lead.

Figure 2:
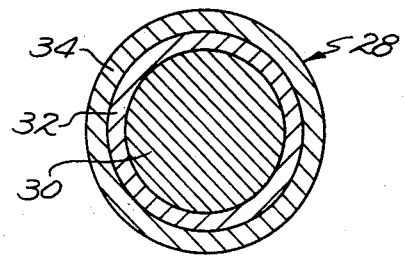

In the accompanying drawings in which one possible embodiment of the invention is illustrated, FIG. 1 is a cross sectional view of an electronic component made in accordance with the invention and FIG. 2 is an enlarged cross sectional view taken on line 2—2 of FIG. 1.

Corresponding reference characters indicate corresponding parts throughout the views of the drawings.

Referring to the drawings numeral 10 represents a diode comprising electrically and thermally conductive bases or blocks 12, 14 of molybdenum or some other suitable material with an element 16 of semiconductor material such as doped silicon disposed between faces 18 and 20 of respective bases 12, 14 and in good electrical and thermal contact therewith. A layer of glass 22 sealingly extends between bases 12 and 14 and around their circumferential periphery. An electric lead 28 is attached to face 24, 26 of respective bases 12, 14 to effect both an electrical and a thermal connection. Lead 28 comprises a core 30 of copper which is surrounded by and metallurgically bonded to a ferrous layer 32 which in turn is surrounded by and metallurgically bonded to a copper layer 34.

Diode 10 is constructed by attaching lead 28 to each of bases 12 and 14 in a conventional manner as by brazing, disposing semi-conductor element 16 between faces 18 and 20 and placing a sleeve of glass material about and between bases 12 and 14. This assembly is then introduced into a furnace and the temperature raised to cause the glass to soften and sealingly engage the circumferential periphery of the bases. This involves raising the assembly to a temperature of approximately 1400° F.

Lead 28 is preferably made by bonding a pair of ferrous strips around a copper core by solid phase bonding techniques known in the art. For example, the clad or composite wire may be formed by bending the ferrous strips to form half cylinders and bonding the strips to each other and to the core in the solid phase by rolling as set forth in U.S. Pat. Nos. 3,320,666 and 3,355,795 and set forth in copending coassigned application Ser. No. 139,503 filed Apr. 11, 1980.

Although the ferrous strips can be prebent as shown in U.S. Pat. No. 3,320,666 excellent concentricity is obtained by using the bonding rolls to bend each of the two strips into a semi-cylindrical shape and controlling the position of the strips with the pinching beads of the bonding rolls on either side of the strips as shown in the patents. The copper core, being relatively soft conforms to the cylindrical space formed between the rollers. After appropriate preparation, e.g., cleaning, the strips and the core are heated to a selected temperature and fed between squeeze rolls to effect reduction in the outside radii of the strips and core with concomitant solid phase bonding between the strips and between the core and the strips as set forth in the above referenced U.S. Pat. No. 3,320,666.

During the bonding process edge fins are formed which project radially from the sheathed core composite. Squeeze rolls of the type disclosed in the patents, which may be limited to a minimum spacing by a flange can be provided without the flange and with sufficient squeezing force through the bends of the rolls can be used to sever these edge fins. Since this pressure is generally more than enough to effect bonding however, as stated in the copending application it is preferred to apply only enough pressure to produce a satisfactory bond and leave the protruding fins for removal by separate severing means downstream of the squeezing rolls once the composite has cooled somewhat from the temperature at which the core and ferrous sheaths are bonded.

The ferrous sheathed copper core is then drawn down to a suitable size by conventional wire drawing techniques and is fed to another set of squeeze rolls along with a pair of copper strips which are bent into half cylinders and are bonded to each other and to the ferrous sheath by passing them through the squeeze rolls in the same mannner as described above. However, in this case the fins of the copper strips are normally sheared off by the bonding rolls since the copper is sufficiently softer and roll life is not significantly adversely affected. Concentricity of the outer copper layer is easier to maintain compared to the prior art copper clad steel lead material referred to above since the diameter of the steel clad core is larger and is more easily guided during the bonding process.

A typical lead wire composite was formed using two strips of 1006 low carbon steel approximately 0.400 inch wide by 0.010 inch thick and a copper core having a diameter of 0.225 inch. The strips and core were thermally cleaned by resistance heating with the temperature of the steel being raised to a point within the range of 1400°–1600° F. at the time they entered the nip of the squeeze rolls and the copper to a somewhat lower temperature. The temperature of the composite leaving the nip of the squeezing rolls was approximately 1400° F. The reduction in cross sectional area to effect the desired solid phase bonding was approximately 10%. This composite was drawn down to approximately 0.290 inch diameter.

Two strips of oxygen free high conductivity copper approximately 0.600 inch wide by 0.020 inch thick were thermally cleaned by resistance heating along with the steel clad copper composite with the temperature of the composite being raised to within the same 1400°–1600° F. range at the time they entered the nip of the squeeze rolls and the copper to a somewhat lower temperature. The temperature of the copper clad composite leaving the nip of the rolls was approximately 1400° F. Again the reduction in cross sectional area to effect the desired solid phase bonding was approximately 10%. The composite was then drawn to approximately 0.032 inches for use as diode lead wire with the core 30 being approximately 0.024 inch in diameter, layer 32 having a thickness of approximately 0.002 inch and layer 34 also having a thickness of approximately 0.002 inch. The steel in the composite comprised approximately 10% of the total cross sectional area which results in an electrical conductivity of approximately 88% that of copper.

Using the lead material of the invention provides a number of advantages, some of which can be noted from the following table:

|  | COPPER CLAD STEEL (80% COPPER BY CROSS SECTIONAL AREA) | ZIRCONIUM COPPER ALLOY | COMPOSITE 28 (12% STEEL BY CROSS SECTIONAL AREA) |
| --- | --- | --- | --- |
| Diameter | 0.032 inch | 0.032 inch | 0.032 inch |
| Electrical Conductivity (IACS) | 80% | 93% | 88% |
| Tensile Strength (psi) |  |  |  |
| Drawn | 68,900 | 76,000 | 75,000 |
| Annealed | 44,000 | 30,000 | 39,800 |
| Elongation |  |  |  |
| Drawn | 1.5% | 1.5% | 1.5% |
| Annealed | 26% | 40% | 27% |
| Strength in Bonding (Deflection with 30 gram load) | 50° | 59° | 49° |

The electrical conductivity of composite 28 is equivalent to that of zirconium copper yet the material is less expensive and is less prone to discoloration at elevated temperatures. In additional to having equivalent tensile and bending strength relative to copper clad steel, the hard steel shell surrounding the soft copper core is very concentric so that the high temperature to which the lead material is subjected during fabrication of electronic components does not cause any thermostatic distortion or bending. Lead material 28, as is true with copper clad steel, can be handled with magnetic conveyors and the like so that in order to plate the leads with tin or other material it is not necessary to subject the devices to barrel plating operations which can cause bending of some leads but rather they can be conveniently dip coated using magnetic conveyor apparatus. In addition to being less sensitive to thermostatic bending of the leads compared to copper clad steel the composite wire material of the invention is also more conducive to the brazing operation. That is, placement of the steel layer closer to the outer periphery of the wire results in better wettability with copper more widely distributed over the facial surface of the lead where it is brazed to the electronic component base. When the lead is cut in preparation of attaching it to the rectifier, the copper is in effect smeared over more of the steel surface area compared to copper clad steel where the steel is concentrated in the center.

Layer 32 which is a ferrous material to provide the desired strength and concentricity to the composite can be any suitable iron alloy. If desired it could be a non-magnetic material such as stainless steel. In order to provide acceptable electrical conductivity while still providing suitable strength, the steel should make up from 5-25% of the cross sectional area of the composite wire. This corresponds to 95-75% conductivity IACS in the case of low carbon steel. Where magnetic properties are particularly desirable and electrical conductivity need not be optimized then the higher end of the steel percentage range can be utilized (e.g. 15-25%) and conversely, where high electrical conductivity is important as in a high power diode, the smaller end of the steel percentage range can be employed (e.g. 5-15%). In some cases it may be desired to change the ratio of thickness of the outer copper layer to the diameter of the core for a given steel percentage of the cross section. For instance, it is desired to increase the radial heat flow characteristic then the core can be made smaller and layer 34 can be made thicker, up to as high as approximately 33% of the cross sectional area of the composite. It may also be desirable to make layer 34 thicker relative to core 30 to provide a lower resistance contact where a deformation contact is required.

It will be understood that various changes in the details, materials, steps and arrangements of park, which have been herein described and illustrated in order to explain the nature of the invention, may be made by those skilled in the art within the principle and scope of the invention as expressed in the appended claims.

What is claimed:

1. A method for minimizing the occurrence of bent leads of an electronic component during manufacture thereof comprising the steps of forming lead material out of composite metal having a first portion of relatively highly electrically conductive and soft material and a second portion of relatively hard and less electrically conductive material, forming the first portion into an elongated circular core, forming the second portion into a layer having a uniform thickness and placing it around the first portion and solid phase bonding the first and second portions while maintaining the second hard portion uniformly concentric relative to the first core portion along its length in order to obviate thermostatic distortion when subjected to elevated processing temperatures, selecting at least one length of said composite metal and electrically and physically attaching an end of the length to the component to serve as a lead, sealing the component by placing electrically insulative sealing material thereon and raising the temperature of the component to an elevated temperature to perfect the seal.

2. A method according to claim 1 in which the first portion is copper and the second portion is ferrous.

3. A method according to claim 2 in which the ferrous portion is steel.

4. A method according to claim 2 further including the step of metallurgically bonding an additional layer of copper to the ferrous layer.

5. A method according to claim 4 in which the steel comprises between 5 and 25% of the cross sectional area of the composite metal.

6. A method according to claim 4 in which the steel comprises approximately 10% of the cross sectional area of the composite metal.

7. A method according to claim 4 in which the lead is approximately 0.032 inches in diameter, the copper core is approximately 0.024 inches in diameter, the steel layer is approximately 0.002 inches in thickness and the additional layer of copper is approximately 0.002 inches in thickness.

* * * * *

UNITED STATES PATENT OFFICE
CERTIFICATE OF CORRECTION

PATENT NO. : 4,598,473
DATED : 07/08/86
INVENTOR(S) : Breit, Henry F.

It is certified that error appears in the above-identified patent and that said Letters Patent are hereby corrected as shown below:

The title [54] should read: – Method For Providing Improved Electric Leads For Electrical Components – .

Signed and Sealed this

Twenty-third Day of September 1986

[SEAL]

Attest:

DONALD J. QUIGG

Attesting Officer     Commissioner of Patents and Trademarks